United States Patent
Kim

(10) Patent No.: US 10,055,286 B2
(45) Date of Patent: Aug. 21, 2018

(54) DATA STORAGE DEVICE AND OPERATING METHOD THEREOF

(71) Applicant: SK hynix Inc., Gyeonggi-do (KR)

(72) Inventor: Jae Bum Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 15/219,380

(22) Filed: Jul. 26, 2016

(65) Prior Publication Data
US 2017/0249208 A1     Aug. 31, 2017

(30) Foreign Application Priority Data
Feb. 26, 2016   (KR) .................. 10-2016-0023615

(51) Int. Cl.
| | | |
|---|---|---|
| H03M 13/00 | (2006.01) | |
| G06F 11/10 | (2006.01) | |
| G11C 29/52 | (2006.01) | |
| G06F 3/06 | (2006.01) | |
| H03M 13/15 | (2006.01) | |
| H03M 13/29 | (2006.01) | |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01); *H03M 13/152* (2013.01); *H03M 13/296* (2013.01); *H03M 13/2909* (2013.01)

(58) Field of Classification Search
CPC .... G06F 11/1068; G06F 3/0619; G06F 3/064; G06F 3/0679; G11C 29/52; G11C 11/5642; G11C 16/28; G11C 29/026; G11C 29/028; G11C 16/08; G11C 16/26; G11C 29/42; G11C 2029/4402; H03M 13/152; H03M 13/2909; H03M 13/296; H03M 13/1125; H03M 13/1117
See application file for complete search history.

(56) References Cited

U.S. PATENT DOCUMENTS

| | | | |
|---|---|---|---|
| 9,430,154 B2 * | 8/2016 | Cohen ................... | G11C 29/52 |
| 2016/0093396 A1 * | 3/2016 | Alhussien .......... | H03M 13/1125 365/185.21 |
| 2016/0284414 A1 * | 9/2016 | Lin ....................... | G11C 16/14 |

FOREIGN PATENT DOCUMENTS

KR        1020100086193        7/2010

\* cited by examiner

*Primary Examiner* — Guerrier Merant
(74) *Attorney, Agent, or Firm* — IP & T Group LLP

(57) ABSTRACT

A data storage device includes a nonvolatile memory device including a target memory region; and a controller suitable for performing a read operation by reading a data chunk from the target memory region based on a read bias and performing an error correction operation for the data chunk, iterating the read operation according to a result of the error correction operation, and adjusting the read bias based on at least one read bias used in one or more previous read operations and at least one correction failure index corresponding to the at least one read bias.

17 Claims, 8 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0023615, filed on Feb. 26, 2016, in the Korean Intellectual Property Office, which is incorporated herein by reference in its entirety.

BACKGROUND

1. Technical Field

Various embodiments generally relate to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a data storage device may include: a nonvolatile memory device including a target memory region; and a controller suitable for performing a read operation by reading a data chunk from the target memory region based on a read bias and performing an error correction operation for the data chunk, iterating the read operation according to a result of the error correction operation, and adjusting the read bias based on at least one read bias used in one or more previous read operations and at least one correction failure index corresponding to the at least one read bias.

In an embodiment, a method for operating a data storage device may include: iterating a read operation according to a result of an error correction operation, the read operation including reading a data chunk from a target memory region based on a read bias, and performing the error correction operation for the data chunk; and adjusting the read bias based on one or more read biases used in one or more previous read operations and correction failure indexes respectively corresponding to the read biases.

In an embodiment, a method for operating a data storage device may include: iterating a test read operation, the test read operation including reading a data chunk from a target memory region based on a read bias, the data chunk including a plurality of data blocks each of which is encoded based on an error correction algorithm, and performing a decoding operation for the respective data blocks, based on the error correction algorithm; adjusting the read bias based on one or more read biases used in one or more previous read operations and correction failure indexes calculated in the decoding operation; and setting a final read bias to be used in a read operation, based on a read bias corresponding to a minimum correction failure index among the correction failure indexes.

DETAILED DESCRIPTION

Figure 1:
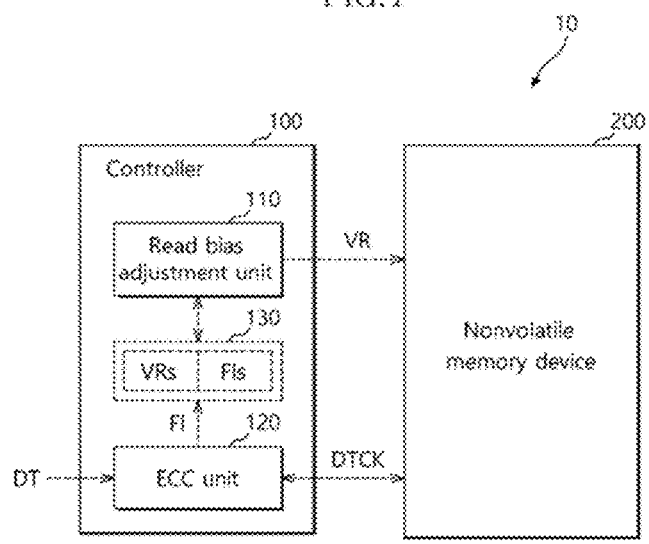
FIG. 1 is a block diagram illustrating a data storage device according to an embodiment of the present invention.

Hereinafter, various embodiments of the present invention including a data storage device and an operating method thereof will be described with reference to the accompanying drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Referring now to FIG. 1 a data storage device 10 is provided, according to an embodiment of the invention.

The data storage device 10 may be configured to store data provided from an external device, in response to a write request from the external device. Also, the data storage device 10 may be configured to provide stored data to the external device, in response to a read request from the external device.

The data storage device 10 may be implemented in the form of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device 10 may include a controller 100 and a nonvolatile memory device 200. The controller 100 may include a read bias adjustment unit 110, an error correction code (ECC) unit 120 and a recording 130.

The controller 100 may control the operation of the data storage device 10. For example, the controller 100 may store data in the nonvolatile memory device 200 in response to a write request transmitted from the external device. Also, the controller 100 may read out data stored in the nonvolatile memory device 200 and output the read out data to the external device in response to a read request transmitted from the external device.

When a read operation of the nonvolatile memory device 200 fails, the controller 100 may re-perform the read operation by adjusting a read bias VR used in the read operation. For example, the controller 100 may perform a read operation by adjusting the read bias VR, reading a data chunk DTCK from a target memory region 260 (see FIG. 2) of the nonvolatile memory device 200 based on the read bias VR and performing an error correction operation for the data chunk DTCK. The controller 100 may iterate a read operation according to a result of the error correction operation. When iterating the read operation, the controller 100 may adjust the read bias VR based on at least one read bias VR used in one or more previous read operations and at least one correction failure index FI corresponding to the at least previously used read bias VR, by referring to the recording 130.

According to an embodiment, for the purpose of setting a final read bias to be used in a read operation, the controller 100 may iteratively perform a test read operation by adjusting the read bias for each iteration. For example, the controller 100 may perform a test read operation by adjusting a read bias VR, reading a data chunk DTCK from the target memory region 260 based on the read bias VR, performing a decoding operation for the data chunk DTCK based on an error correction algorithm and adding the read bias VR and a correction failure index FI for the read bias calculated in the decoding operation, to the recording 130. This operation may be repeated a number of times. Finally, the controller 100 may set a final read bias to be used in a read operation, based on a read bias VR corresponding to a minimum correction failure index among a plurality correction failure indexes FIs included in the recording 130 during the multiple iterations.

When a read operation is iterated, the read bias adjustment unit 110 adjusts the read bias VR based on at least one read bias VR used in any previous read operations and at least one correction failure index FI corresponding to the at least one read bias VR, which is included in the recording 130. In an embodiment, when a read operation is iterated, the read bias adjustment unit 110 may adjust the read bias VR based on a plurality of biases VRs used in any previous read operations and correction failure indexes FI is respectively corresponding to the read biases VRs, which are included in the recording 130. The adjusted read bias VR may be provided to the nonvolatile memory device 200 and be used in the read operation of the nonvolatile memory device 200.

The ECC unit 120 may generate data blocks by receiving initial data DT and performing, by a predetermined unit, a first encoding operation for the data DT based on a first algorithm. The ECC unit 120 may then generate a data chunk DTCK by performing a second encoding operation for the generated data blocks based on a second algorithm. For example, the first algorithm may be a Bose, Chaudhuri, Hocquenghem (BCH) code algorithm, and the second algorithm may be a Turbo Product Code (TPC) algorithm. However, it is to be noted that the embodiment is not limited to the aforementioned specific algorithms.

The ECC unit 120 may perform an error correction operation for a data chunk DTCK read from the nonvolatile memory device 200. For example, the ECC unit 120 may perform a first decoding operation for respective data blocks of the data chunk DTCK based on the first algorithm, and may perform a second decoding operation for those data blocks for which the first decoding operation has failed, based on the second algorithm.

The ECC unit 120 may calculate a correction failure index FI based on the number of the data blocks for which the first decoding operation has failed. For example, in an embodiment, the ECC unit 120 may calculate a correction failure index FI to be equal to the number of the data blocks for which the first decoding operation has failed. A read bias VR used in a current read operation and a corresponding correction failure index FI may be stored together in the recording 130. In another, embodiment, the correction failure index FI may be substantially proportional to the error rate of the data chunk DTCK. Regardless of the exact relationship between the failure index and the number of data blocks for which the first decoding method failed, the failure index FI should reflect the effectiveness of the current read bias VR in minimizing the number of error data blocks.

The correction failure index FI may be used in determining an adjustment value to be added to the current read bias VR, so as to adjust a read bias VR for a subsequent read operation. Moreover, the correction failure index FI may be used in selecting a read bias VR which minimizes an error rate, among a plurality of read biases VRs included in the recording 130. For example, amongst a plurality of read biases VRs stored in the register a read bias having the lowest failure index FI may be selected for minimizing the number of data block errors.

The nonvolatile memory device 200 may store data transmitted from the controller 100 and may read out stored data and transmit the read-out data to the controller 100, according to the control of the controller 100.

The nonvolatile memory device 200 may include one of a flash memory, such as NAND flash or NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

Figure 2:
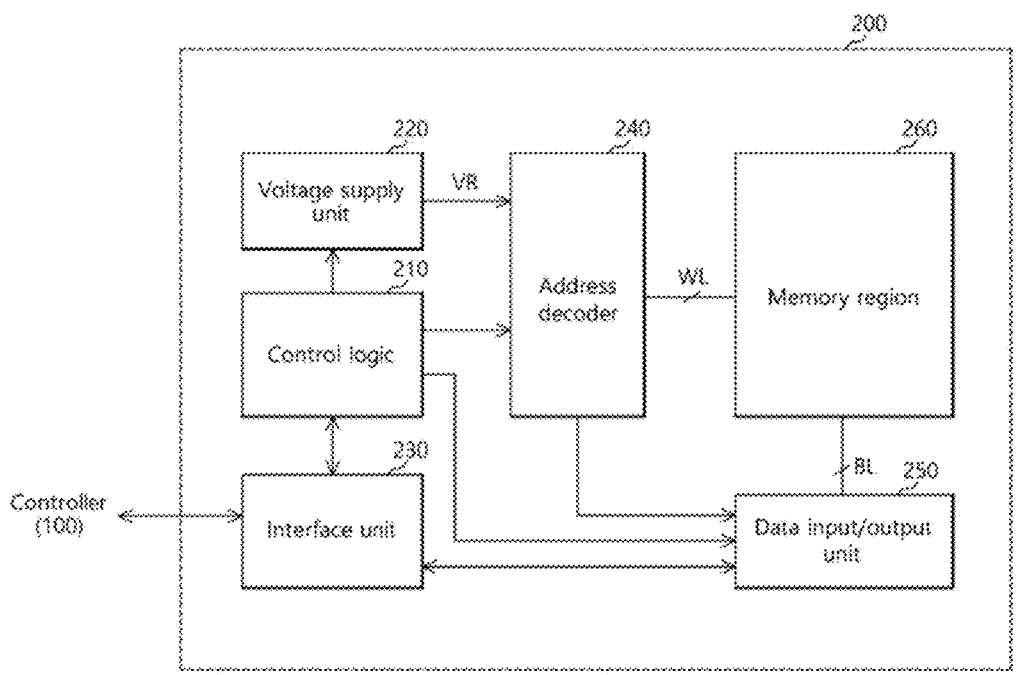
FIG. 2 is a block diagram illustrating a configuration of the nonvolatile memory device shown in FIG. 1, according to an embodiment of the present invention.

FIG. 2 is a block diagram illustrating a configuration of the nonvolatile memory device 200 shown in FIG. 1.

The nonvolatile memory device 200 may include a control logic 210, a voltage supply unit 220, an interface unit 230, an address decoder 240, a data input/output unit 250, and a memory region 260.

The control logic 210 may control general operations of the nonvolatile memory device 200 according to control of the controller 100. The control logic 210 may receive a command transmitted from the controller 100, through the interface unit 230, and may transmit control signals to internal units of the nonvolatile memory device 200 in response to the command.

The voltage supply unit 220 may generate various operation voltages necessary for the operation of the nonvolatile memory device 200, according to control of the control logic 210. The voltage supply unit 220 may supply a read bias VR to be used in a read operation, to the address decoder 240.

The interface unit 230 may exchange various control signals including commands and addresses and data with the controller 100. The interface unit 230 may transmit various control signals and data inputted thereto, to the internal units of the nonvolatile memory device 200.

The address decoder 240 may decode addresses to select a specific to be accessed in the memory region 260. The address decoder 240 may selectively drive word lines WL and control the data input/output unit 250 to selectively drive bit lines BL, according to the decoding results.

The data input/output unit 250 may transmit data transmitted from the interface unit 230, to the memory region 260 through the bit lines BL. The data input/output unit 250 may transmit data read out from the memory region 260 through the bit lines BL, to the interface unit 230. The data input/output unit 250 may sense current formed as memory cells included in the memory region 260 are turned on or off in response to a read bias VR, and may obtain data read from the memory cells, according to a sensing result.

The memory region 260 may be coupled with the address decoder 240 through the word lines WL, and may be coupled with the data input/output unit 250 through the bit lines BL. The memory region 260 may include a plurality of memory cells which are respectively disposed at areas where the word lines WL and the bit lines BL intersect with each other and in which data are stored. The memory region 260 may include a memory cell array of a two-dimensional or three-dimensional structure.

Figure 3:
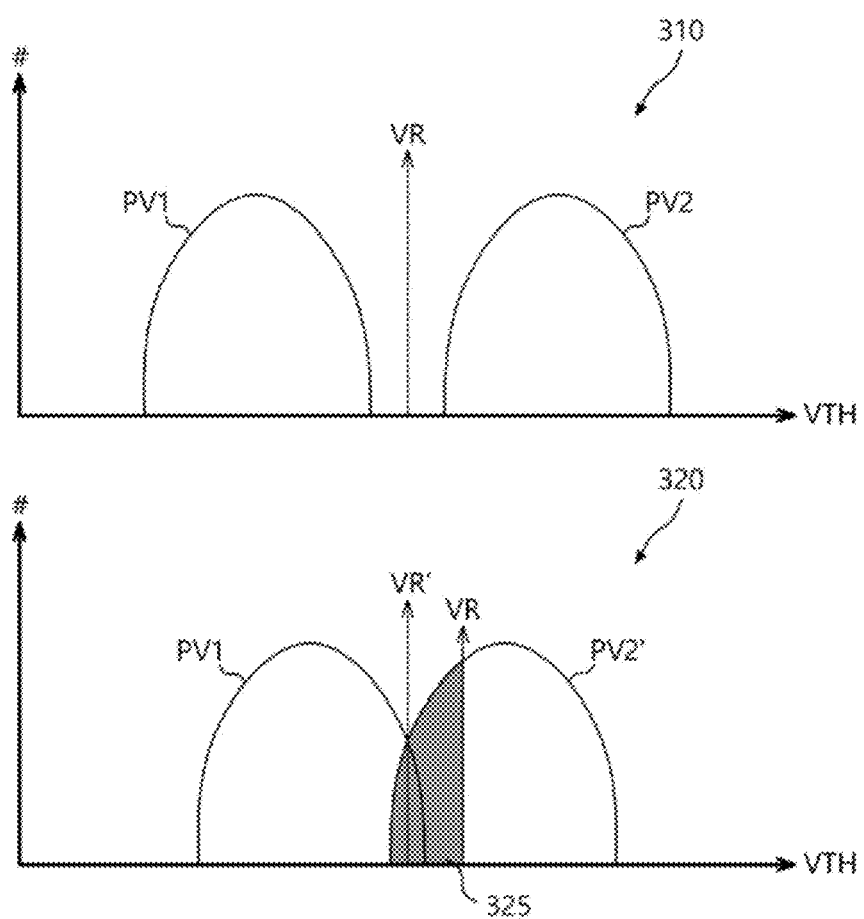
FIG. 3 is a graph illustrating an example of threshold voltage distributions of memory cells.

FIG. 3 is a graph illustrating an example of threshold voltage distributions PV1 and PV2 of memory cells. In the graph of FIG. 3, the horizontal axis VTH represents a threshold voltage of a memory cell, and the vertical axis # represents the number of memory cells corresponding to a threshold voltage.

Referring to FIG. 3, memory cells may form threshold voltage distributions PV1 and PV2 according to data stored therein (310). Memory cells stored with first data may form the threshold voltage distribution PV1, and memory cells stored with second data may form the threshold voltage distribution PV2.

A read bias VR may be applied to a word line which is coupled to a memory cell, to read data stored in the memory cell. Since a memory cell is turned on or off in response to a read bias VR according to a threshold voltage, (i.e., data stored therein), the data stored in the memory cell may be read by detecting turn-on or turn-off of the memory cell when the read bias VR is applied.

Meanwhile, threshold voltages of memory cells may be changed by various factors. For example, the threshold voltage distribution PV2 may move to a threshold voltage distribution PV2' (320). In this regard, if a read operation is performed based on the read bias VR, memory cells corresponding to the shaded region (325) of the threshold voltage distribution PV2' output error bits. However, if a read operation is performed based on a read bias VR' positioned at the valley between the threshold voltage distributions PV1 and PV2' (i.e., an optimal read bias VR'), the error rate of read-out data may be minimized.

In the meantime, although the data chunk DTCK read from the nonvolatile memory device 200 in FIG. 1 includes error bits, because the ECC unit 120 may only correct error bits within its error correction capability, it is advantageous to minimize the error rate of the data chunk DTCK. Performing, the read operation using the optimal read bias VR' minimizes the error rate.

If it is possible to precisely figure out current threshold voltage distributions PV1 and PV2' of memory cells, the optimal read bias VR' may be precisely set. However, if not so, the optimal read bias VR' should be indirectly estimated. According to the present embodiment, a correction failure index FI is employed in adjusting the read bias VR to approach the optimal read bias VR'. Moreover, a correction failure index FI may be useful in selecting a read bias closest to the optimal read bias VR' among a plurality of read biases. Detailed descriptions thereof will be made later.

Figure 4:
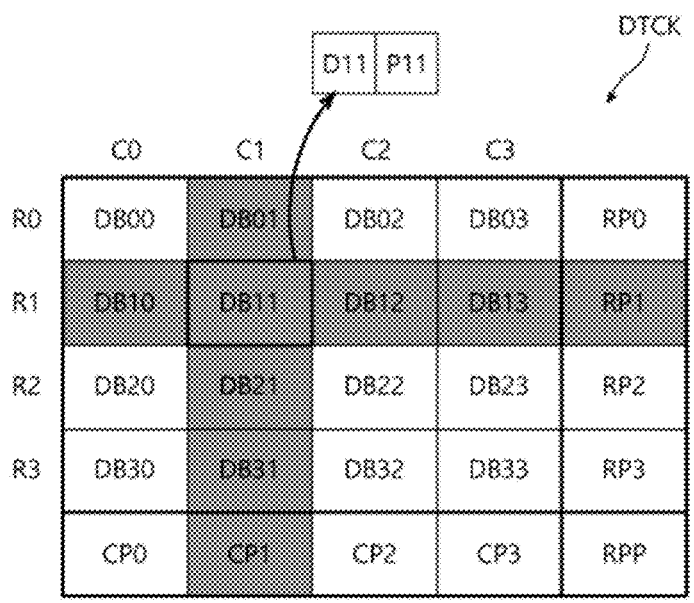
FIG. 4 is a diagram illustrating encoding and decoding methods by the ECC unit of FIG. 1, according to an embodiment of the present invention.

FIG. 4 is a diagram illustrating encoding and decoding methods by the ECC unit 120 of FIG. 1.

The ECC unit 120 may first generate data blocks DB00 to DB33 by performing, by the predetermined unit, the first encoding operation for the initial data DT based on the BCH code algorithm. For example, the data block DB11 may include a portion D11 of the initial data DT and parity data P11 generated for the portion D11 based on the BCH code algorithm.

Further, the ECC unit 120 may generate row parity data RP0 to RP3 and column parity data CP0 to CP3 by performing, based on the TPC algorithm, the second encoding operation for respective row groups R0 to R3 and respective column groups C0 to C3 which are generated as the data blocks DB00 to DB33 are arranged in row and column directions. For example, the ECC unit 120 may generate the row parity data RP1 for the row group R1 and generate the column parity data CP1 for the column group C1. Furthermore, the ECC unit 120 may generate parity data RPP by performing an encoding operation for the row parity data RP0 to RP3.

If the data chunk DTCK is read from the nonvolatile memory device 200, the ECC unit 120 may first perform the first decoding operation for the data blocks DB00 to DB33 based on the BCH code algorithm. The ECC unit 120 may perform the second decoding operation for data blocks for which the first decoding operation has failed, based on the TPC algorithm. For example, when the first decoding operation has failed for the data block DB11, the ECC unit 120 may correct the data block DB11 by performing the second decoding operation for the row group R1 and the row parity data RP1 and/or performing the second decoding operation for the column group C1 and the column parity data CP1.

Figure 5:
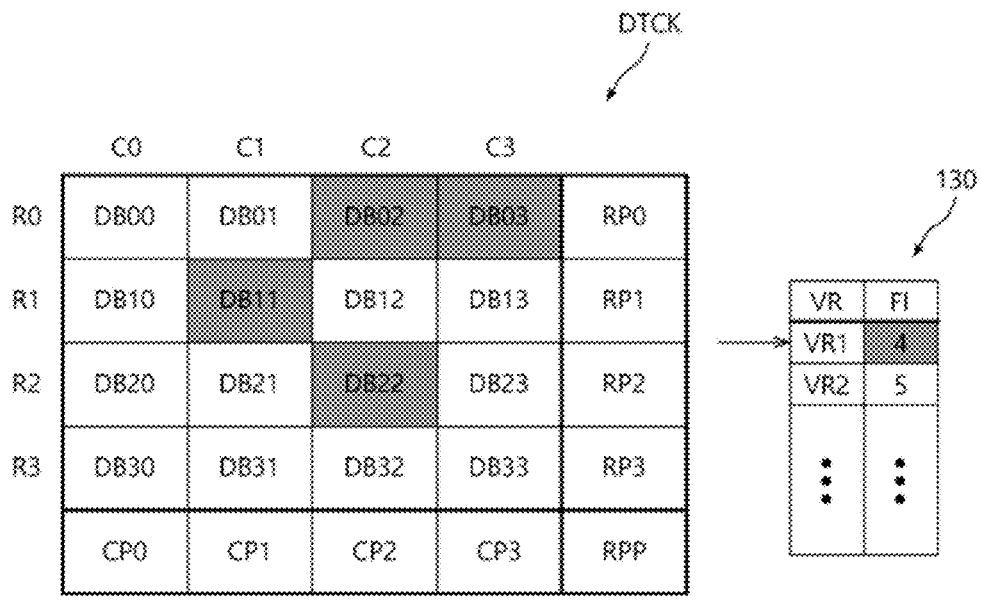
FIG. 5 is a diagram illustrating a method in which a correction failure index is calculated in an error correction operation.

FIG. 5 is a diagram illustrating a method in which a correction failure index FI is calculated in an error correction operation.

Referring to FIG. 5, data blocks DB02, DB03, DB11 and DB22 may be data blocks for which the first decoding operation based on the BCH code algorithm has failed. At this time, a correction failure index FI may be "4" as the number of the data blocks DB02, DB03, DB11 and DB22 for which the first decoding operation has failed. The correction failure index FI may be determined before the data blocks DB02, DB03, DB11 and DB22 are error-corrected through the second decoding operation based on the TPC algorithm.

The correction failure index FI may correspond to a read bias Vi which has been used to read the data chunk DTCK. In other words, if the read bias VR1 is adjusted to a read bias VR2 and the data chunk DTCK is read again by using the adjusted read bias VR2, a correction failure index FI may be calculated as another value (e.g., "5"). Thus, a correction failure index FI may reflect appropriateness of a corresponding read bias VR.

A read bias VR used in a read operation and a correction failure index FI corresponding thereto may be added to the recording 130 of the controller 100 in FIG. 1. The recording 130 may include read biases VRs used in read operations and correction failure indexes FIs respectively corresponding thereto.

Figure 6:
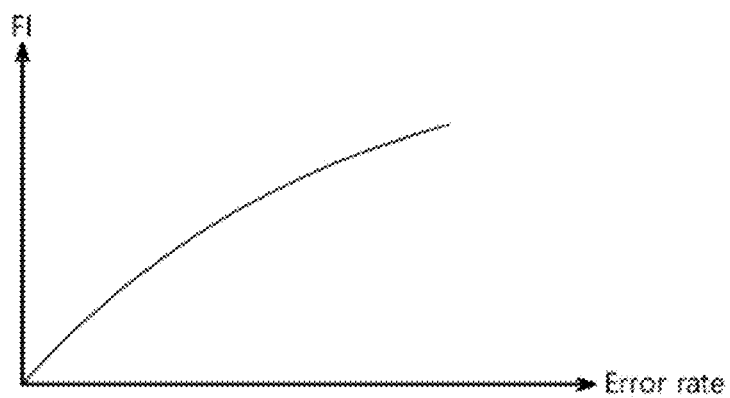
FIG. 6 is a diagram illustrating a relationship between a correction failure index and the error rate of a data chunk.

FIG. 6 is a diagram illustrating the relationship between a correction failure index FI and the error rate of the data chunk DTCK.

Referring to FIG. 6, a correction failure index FI and an error rate may be substantially proportional to each other. This is because, when the error rate of the data chunk DTCK is high, the number of data blocks for which the first decoding operation fails will increase.

Thus, as a correction failure index FI is small, a read bias VR may approach the optimal read bias VR' of FIG. 3.

Figure 7:
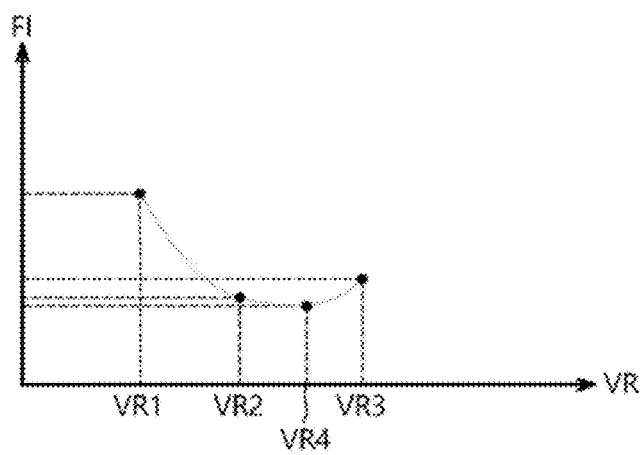
FIG. 7 is a diagram illustrating a method in which the data storage device of FIG. 1 adjusts a read bias based on previous correction failure indexes, according to an embodiment of the present invention.

FIG. 7 is a diagram illustrating a method in which the data storage device 10 of FIG. 1 adjusts a read bias VR based on previous correction failure indexes FIs. In FIG. 7, a read bias VR may be adjusted in the sequence of read biases VR1 to VR4.

Referring to FIG. 7, when a read operation is performed, for example, the start read bias VR1 may be set, the data chunk DTCK may be read based on the read bias VR1, and an error correction operation may be performed for the read-out data chunk DTCK. When the error correction operation has failed, a read operation may be iterated as the read bias VR1 is adjusted to the read bias VR2.

A read bias VR may be set based on a minimum value estimation algorithm that uses read biases VRs used in previous read operations and correction failure indexes FIs respectively corresponding to the read biases VRs. The minimum value estimation algorithm may be an algorithm that determines, based on previously used read biases VRs and correction failure indexes FIs, a sign and a magnitude of an adjustment amount of a read bias VR to move to a read bias VR corresponding to a minimum value of a correction failure index FI.

A sign of an adjustment amount of a read bias VR may correspond to a direction where a previous correction failure index FI decreases. A magnitude of an adjustment amount of a read bias VR may correspond to a predetermined set value or may be set in correspondence to variation amounts of previous correction failure indexes FIs. For example, if a correction failure index FI increases by a small amount as a result of adjusting the read bias VR2 to the read bias VR3, the next read bias VR4 may be moved by a smaller adjustment amount in a direction opposite to a previous direction.

According to an embodiment, a read bias VR may be adjusted according to the method of FIG. 7 not only when a read operation for obtaining data stored in memory cells is iterated but also when a test read operation for tracing the optimal read bias VR' of FIG. 3 is iterated. In this regard, the read operation may be ended when error-corrected data is obtained, and the test read operation may be ended when an appropriate read bias VR to be used in a read operation is set.

Figure 8:
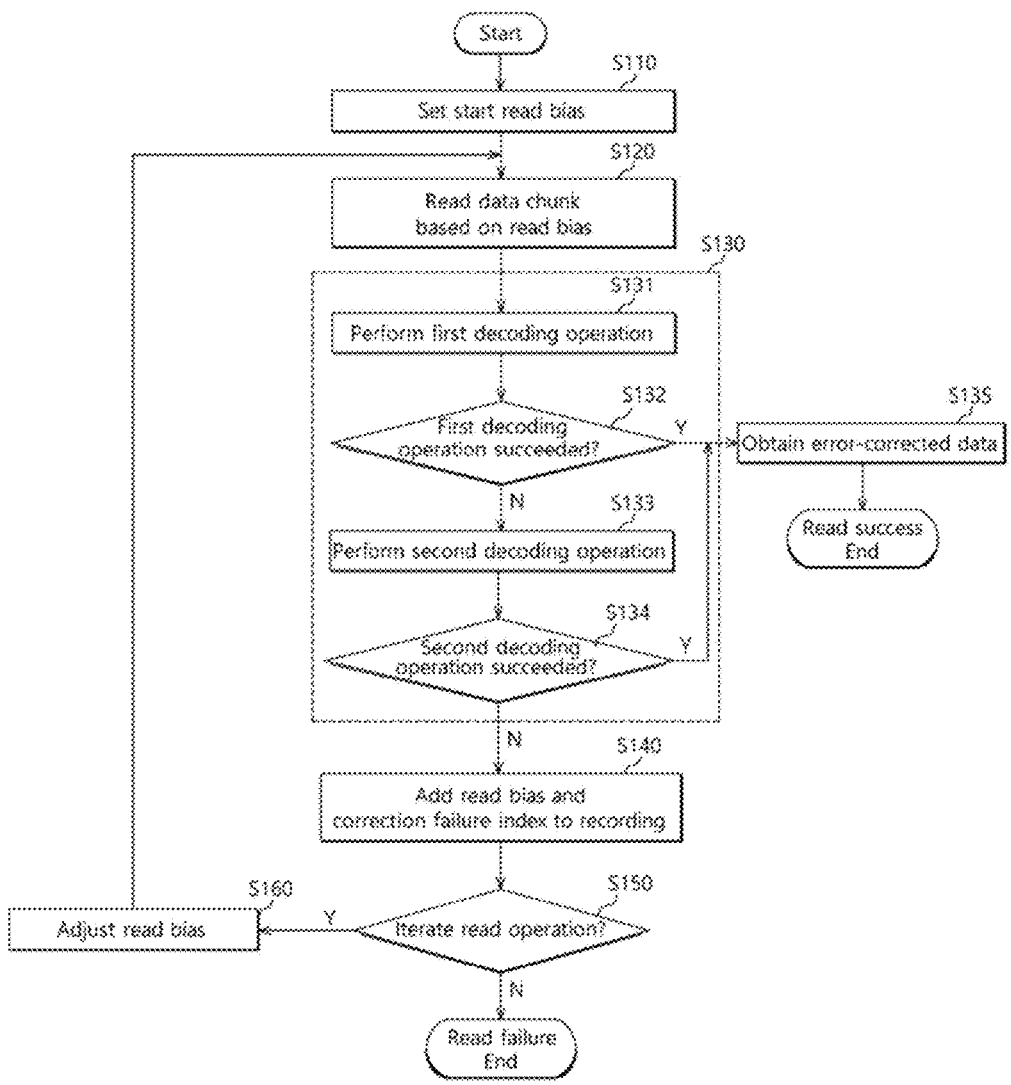
FIG. 8 is a flow chart illustrating a method for the data storage device of FIG. 1 to perform a read operation, according to an embodiment of the present invention.

FIG. 8 is a flow chart illustrating a method for the data storage device 10 of FIG. 1 to perform a read operation. For example, the controller 100 may iterate, when an initial read operation of the nonvolatile memory device 200 has failed, a read operation including steps S120 to S140 by adjusting a read bias VR based on a correction failure index FI.

At step S110, the controller 100 may set a start read bias VR.

At step S120, the controller 100 may read the data chunk DTCK from the nonvolatile memory device 200 based on the set read bias VR.

At step S130, the controller 100 may perform an error correction operation for the read-out data chunk DTCK. The step S130 may include steps S131, S132, S133 and S134.

In detail, at step S131, the controller 100 may perform a first decoding operation for the data chunk DTCK, based on a first algorithm. The first algorithm may, for example, be the BCH code algorithm. The controller 100 may perform: the first decoding operation for respective data blocks included in the data chunk DTCK.

At step S132, the controller 100 may determine whether the first decoding operation has succeeded for all the data blocks. In the case where the first decoding operation has succeeded, the process may proceed to step S135. In the case where the first decoding operation has failed for one or more data blocks, the process may proceed to the step S133.

At step S135, the controller 100 may obtain error-corrected data. Accordingly, the read operation may be ended as a success.

At step S133, the controller 100 may perform a second decoding operation for data blocks for which the first decoding operation has failed, based on a second algorithm. The second algorithm may, for example, be the TPC algorithm.

At step S134, the controller 100 may determine whether the second decoding operation has succeeded. In the case where the second decoding operation has succeeded, the process may proceed to the step S135. In the case where the second decoding operation has failed, the process may proceed to the step S140.

At step S140, the controller 100 may add the read bias VR and a correction failure index FI calculated through the first decoding operation, to the recording 130. The correction failure index FI may for example be the number of data blocks in the data chunk DTCK, for which the first decoding operation has failed.

At step S150, the controller 100 may determine whether to iterate a read operation. For example, the controller 100 may determine whether to iterate a read operation, by determining whether a count which is increased when performing a read operation has reached a threshold count. When it is determined that a read operation is not to be iterated, the read operation may be ended as a fail. When it is determined that a read operation is to be iterated, the process may proceed to step S160.

At step S160, the controller 100 may adjust a read bias VR based on read biases VRs and correction failure indexes FIs respectively corresponding to the read biases VRs, which are included in the recording 130, The controller 100 may determine, based on previously used read biases VRs and correction failure indexes FIs, a sign and a magnitude of an adjustment amount of a read bias VR to move to a minimum value of a correction failure index FI and a read bias VR corresponding thereto. Then, the process may proceed to the step S120, and a read operation may be iterated based on a new read bias VR.

According to an embodiment, at step S150, when it is determined that a read operation is not to be iterated, the controller 100 may not end the read operation as a fail, and instead, may perform an additional read operation based on various read bias adjustment methods generally known in the art. The additional read operation may be started by newly setting a start read bias VR, and the start read bias VR may be set based on a read bias VR corresponding to a minimum correction failure index FI among correction failure indexes FIs included in the recording 130.

Figure 9:
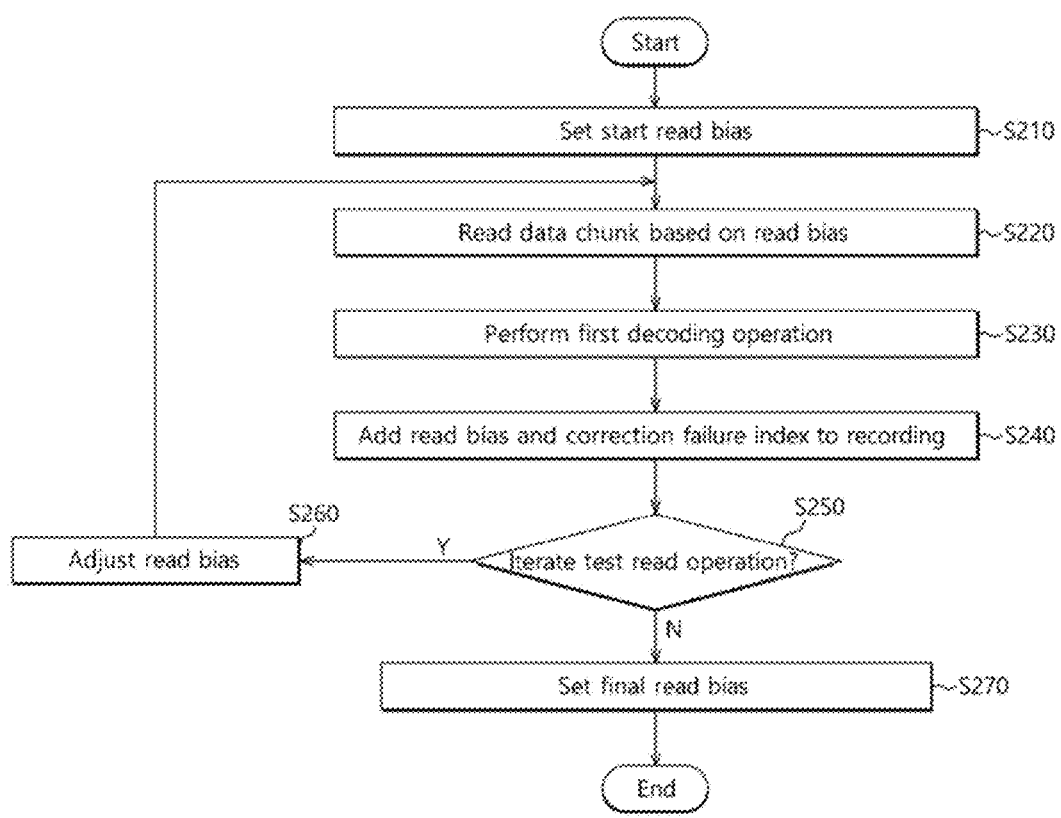
FIG. 9 is a flow chart illustrating a method for the data storage device of FIG. 1 to perform an optimum read bias estimation operation, according to an embodiment of the invention.

FIG. 9 is a flow chart illustrating a method for the data storage device 10 of FIG. 1 to perform an optimum read bias estimation operation. When performing the optimum read bias estimation operation, the controller 100 may iterate a test read operation including steps S220 to S240 by adjusting a read bias VR based on a correction failure index FI.

At step S210, the controller 100 may set a start read bias VR.

At step S220, the controller 100 may read the data chunk DTCK from the nonvolatile memory device 200 based on the set read bias VR.

At step S230, the controller 100 may perform a first decoding operation for the data chunk DTCK, based on a first algorithm. The first algorithm may, for example, be the BCH code algorithm. The controller 100 may perform the first decoding operation for respective data blocks included in the data chunk DTCK.

At step S240, the controller 100 may add the read bias VR and a correction failure index F calculated through the first decoding operation, to the recording 130. The correction failure index FI may, for example, be the number of data blocks in the data chunk DTCK, for which the first decoding operation has failed.

At step S250, the controller 100 may determine whether to iterate a test read operation. For example, the controller 100 may determine whether to iterate a test read operation, by determining whether a count which is increased when performing a test read operation has reached a threshold count. For another example, the controller 100 may determine whether to iterate a test read operation, by determining whether a currently calculated correction failure index FI is smaller than a threshold index. When it is determined that a test read operation is to be iterated, the process may proceed to step S260. When it is determined that a test read operation is not to be iterated, the process may proceed to step S270.

At step S260, the controller 100 may adjust a read bias VR based on read biases VR and correction failure indexes FI respectively corresponding to the read biases VRs, which are included in the recording 130. The controller 100 may determine, based on previously used read biases VRs and correction failure indexes FIs, a sign and a magnitude of an adjustment amount of a read bias VR to move to a minimum value of a correction failure index FI and a read bias VR corresponding thereto. Then, the process may proceed to the step S220, and a test read operation may be iterated based on a new read bias VR.

At step S270, the controller 100 may set a final read bias to be used in a read operation, based on a read bias VR corresponding to a minimum correction failure index FI among correction failure indexes FIs included in the recording 130. For example, the controller 100 may set the read bias VR corresponding to the minimum correction failure index FI, as the final read bias.

According to an embodiment, the controller 100 may set the read bias VR corresponding to the minimum correction failure index FI, as a start read bias VR to be used in various read bias adjustment methods generally known in the art.

According to an embodiment, read biases VRs to be used in a test read operation may not be adjusted based on correction failure indexes FIs, but may be adjusted by being selected among read biases VRs included in a predetermined table. In this case, correction failure indexes FIs respectively corresponding to the read biases VRs included in the table may be calculated, and a read bias VR corresponding to a minimum correction failure index FI may be selected.

Figure 10:
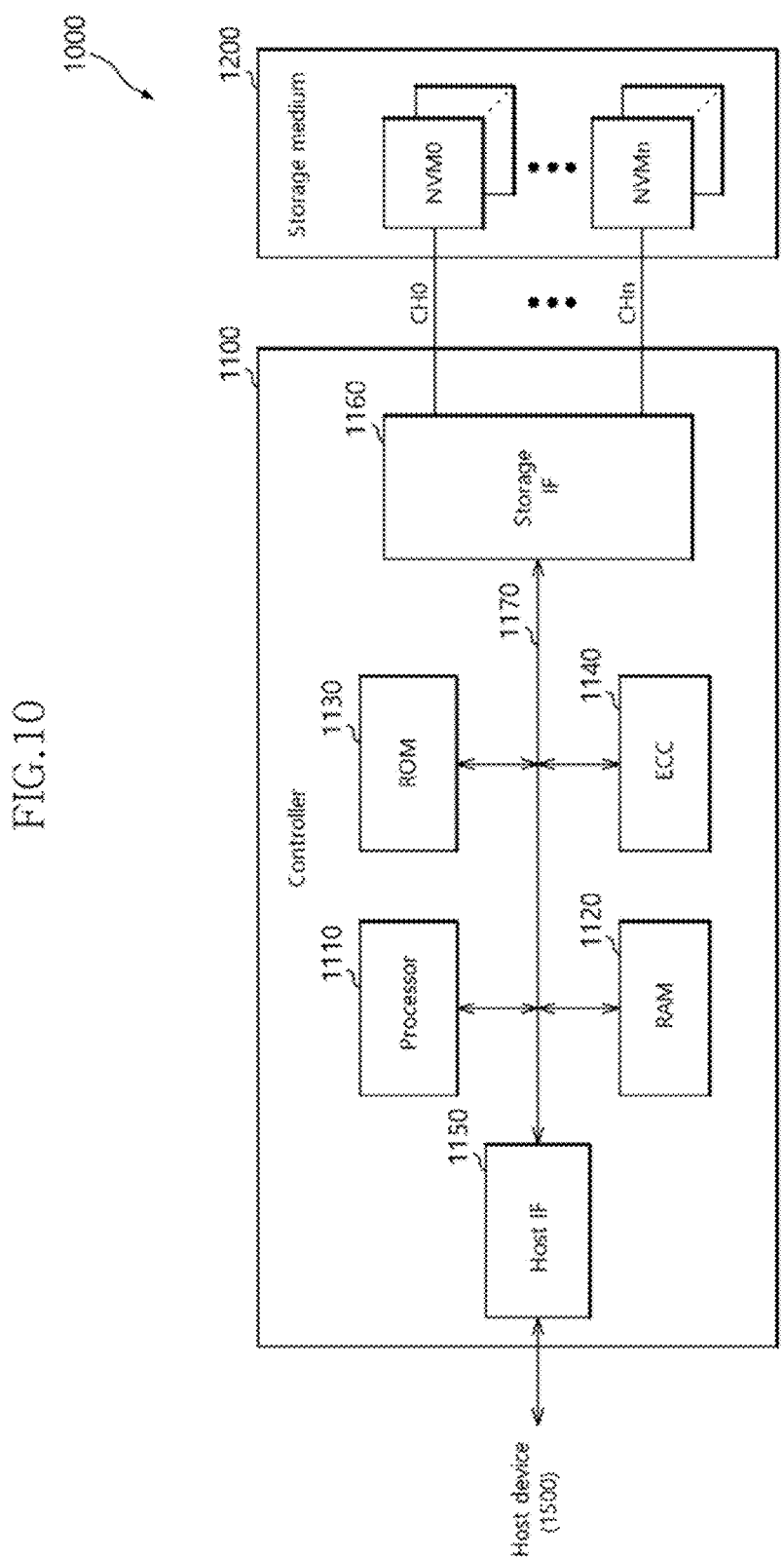
FIG. 10 is a block diagram illustrating a solid state drive (SSD) according to an embodiment of the present invention.

FIG. 10 is a block diagram illustrating a solid state drive (SSD) 1000, according to an embodiment of the invention.

The SSD 1000 may include a controller 1100 and a storage medium 1200.

The controller 1100 may be configured in substantially the same manner as the controller 100 of FIG. 1. When a read operation has failed, the controller 1100 may re-perform a read operation by adjusting a read bias to be used in the read operation. In detail, the controller 1100 may perform a read operation by adjusting a read bias, reading a data chunk from a target memory region based on the read bias and performing an error correction operation for the data chunk, and may iterate a read operation according to a result of the error correction operation. When iterating the read operation, the controller 1100 may adjust the read bias based on read biases used in one or more previous read operations and correction failure indexes respectively corresponding to the read biases, by referring to a recording.

Also, in order to set a final read bias to be used in a read operation, the controller 1100 may iteratively perform a test read operation by adjusting a read bias. The controller 1100 may perform a test read operation by adjusting a read bias, reading a data chunk from a target memory region based on the read bias, performing a decoding operation for the data chunk based on an error correction algorithm and adding the read bias and a correction failure index calculated in the decoding operation, to the recording. Further, the controller 1100 may set a final read bias to be used in a read operation, based on a read bias corresponding to a minimum correction failure index among correction failure indexes included in the recording.

The controller 1100 may include a processor 1110, a random access memory (RAM) 1120, a read only memory (ROM) 1130, an error correction code (ECC) unit 1140, a host interface 1150, and a storage medium interface 1160.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

The RAM 1120 may store programs and program data to be used by the processor 1110. The RAM 1120 may temporarily store data transmitted from the host interface 1150 before transferring them to the storage medium 1200, and may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, and the like with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to the control of the controller 1100.

Figure 11:
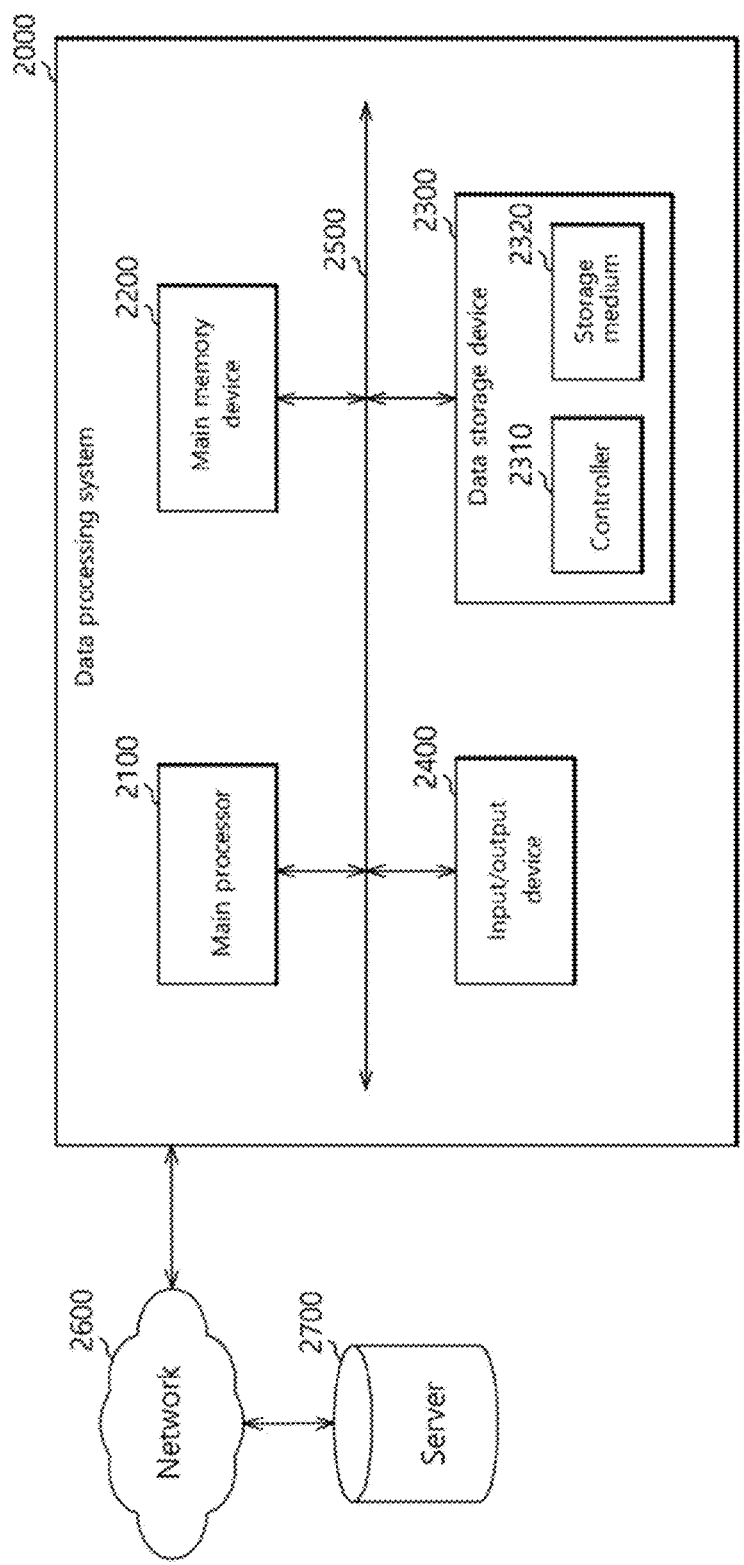
FIG. 11 is a block diagram illustrating a data processing system including a data storage device, according to an embodiment of the present invention.

FIG. 11 is a block diagram illustrating a data processing system 2000 to which the data storage device 10 of FIG. 1 is applied as a data storage device 2300, according to an embodiment of the invention.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the following claims.

What is claimed is:

1. A data storage device comprising:
a nonvolatile memory device including a target memory region; and
a controller suitable for performing a read operation by reading a data chunk from the target memory region based on a read bias and performing an error correction operation for the data chunk, iterating the read operation according to a result of the error correction operation, and adjusting the read bias based on at least one read bias used in one or more previous read operations and at least one correction failure index corresponding to the at least one read bias,
wherein, when performing the error correction operation, the controller performs a first decoding operation for a plurality of respective data blocks included in the data chunk, based on a first algorithm, and
wherein the at least one correction failure index is calculated based on the number of the one or more data blocks for which the first decoding operation failed using the at least one read bias.

2. The data storage device according to claim 1, wherein, when performing the error correction operation, the controller performs a second decoding operation for one or more data blocks for which the first decoding operation has failed, based on a second algorithm.

3. The data storage device according to claim 2, wherein the first algorithm is a Bose, Chaudhuri, Hocquenghem (BCH) code algorithm, and the second algorithm is a Turbo Product Code (TPC) algorithm.

4. The data storage device according to claim 1, wherein the controller iterates the read operation by a threshold value.

5. The data storage device according to claim 1, wherein the controller adjusts the read bias based on a minimum value estimation algorithm that uses the at least one read bias and the at least one correction failure index.

6. A method for operating a data storage device, comprising:
iterating a read operation according to a result of an error correction operation, the read operation including reading a data chunk from a target memory region based on a read bias, and performing the error correction operation for the data chunk; and
adjusting the read bias based on one or more read biases used in one or more previous read operations and correction failure indexes respectively corresponding to the read biases,
wherein the performing of the error correction operation comprises performing a first decoding operation for a plurality of respective data blocks included in the data chunk, based on a first algorithm, and
wherein each correction failure index is determined based on the number of the one or more data blocks for which the first decoding operation has failed.

7. The method according to claim 6, wherein the performing of the error correction operation further comprises:
performing a second decoding operation for one or more data blocks for which the first decoding operation has failed, based on a second algorithm.

8. The method according to claim 7, wherein the first algorithm is a Bose, Chaudhuri, Hocquenghem (BCH) code algorithm, and the second algorithm is a Turbo Product Code (TPC) algorithm.

9. The method according to claim 6, wherein the read operation further comprises:
adding the read bias and a correction failure index corresponding to the read bias, to a recording, according to a result of the error correction operation.

10. The method according to claim 6, further comprising:
increasing a count when performing the read operation;
determining whether the count has reached a threshold count; and
ending iteration of the read operation according to a result of the determining.

11. The method according to claim 6, wherein the adjusting of the read bias comprises:
adjusting the read bias based on a minimum value estimation algorithm that uses the read biases and the correction failure indexes.

12. A method for operating a data storage device, comprising:
iterating a test read operation, the test read operation including reading a data chunk from a target memory region based on a read bias, the data chunk including a plurality of data blocks each of which is encoded based on an error correction algorithm, and performing a decoding operation for the respective data blocks, based on the error correction algorithm;
adjusting the read bias based on one or more read biases used in one or more previous read operations and correction failure indexes calculated in the decoding operation; and setting a final read bias to be used in a read operation, based on a read bias corresponding to a minimum correction failure index among the correction failure indexes, wherein each correction failure index is calculated based on the number of one or more data blocks for which the decoding operation has failed.

13. The method according to claim 12, wherein the adjusting of the read bias comprises:

adjusting the read bias based on a minimum value estimation algorithm that uses read biases and the correction failure indexes.

14. The method according to claim 12, wherein the adjusting of the read bias comprises:

adjusting the read bias by referring to a table that includes a plurality of predetermined read biases.

15. The method according to claim 12, wherein the error correction algorithm is a Bose, Chaudhuri, Hocquenghem (BCH) code algorithm.

16. The method according to claim 12, further comprising:

increasing a count when performing an index calculating operation;

determining whether the count has reached a threshold count; and ending iteration of the index calculating operation according to a result of the determining.

17. The method according to claim 12, further comprising:

determining whether the correction failure index is smaller than a threshold index; and ending iteration of the index calculating operation according to a result of the determining.

* * * * *